United States Patent

Zennamo, Jr. et al.

[11] Patent Number: 5,770,983
[45] Date of Patent: Jun. 23, 1998

[54] REDUCED LENGTH TUNED FILTER HAVING TRANSVERSE ORIENTED COILS

[75] Inventors: Joseph A. Zennamo, Jr., Skaneateles; Joseph N. Maguire, Syracuse, both of N.Y.

[73] Assignee: Eagle Comtronics, Inc., Clay, N.Y.

[21] Appl. No.: 764,507

[22] Filed: Dec. 12, 1996

Related U.S. Application Data

[63] Continuation of Ser. No. 948,417, Sep. 22, 1992, abandoned.

[51] Int. Cl.$^6$ ................................................ H03H 7/01
[52] U.S. Cl. .......................... 333/168; 333/175; 333/185
[58] Field of Search ........................... 333/167, 174–177, 333/180, 175, 176, 168, 185; 334/71, 75, 70

[56] References Cited

U.S. PATENT DOCUMENTS

| | | | |
|---|---|---|---|
| 2,982,928 | 5/1961 | Kall | 333/167 |
| 2,994,844 | 8/1961 | Niederman | 333/185 |
| 3,644,848 | 2/1972 | Kruczek | 333/185 |
| 4,451,803 | 5/1984 | Holdsworth et al. | 333/12 |
| 4,672,337 | 6/1987 | Thibeault | 333/185 X |
| 4,701,726 | 10/1987 | Holdsworth | 333/185 |
| 4,845,447 | 7/1989 | Holdsworth | 333/167 |
| 4,901,043 | 2/1990 | Palinkas | 333/185 X |
| 5,150,087 | 9/1992 | Yoshie et al. | 333/185 |
| 5,278,525 | 1/1994 | Palinkas | 333/175 |

FOREIGN PATENT DOCUMENTS

| | | | |
|---|---|---|---|
| 2667205 | 3/1992 | France | 333/185 |

*Primary Examiner*—Benny Lee
*Attorney, Agent, or Firm*—Parkhurst & Wendel

[57] ABSTRACT

The invention provides a tuned filter of reduced overall length in which two coils (air core inductors) are placed side by side, in mounting locations that are transverse with respect to the longitudinal direction of the filter, instead of in-line or diagonal to each other. The transverse mounting of the coils, depending on the number of poles in the filter, results in a reduction in the overall length of the filter to at least 25% to greater than 50% than can be realized in comparison to conventional in-line filter designs. In addition, the transverse mounting configuration results in an improvement in the electrical performance for both the in band and high frequency responses of the tuned notch filter.

6 Claims, 2 Drawing Sheets

REDUCED LENGTH TUNED FILTER HAVING TRANSVERSE ORIENTED COILS

This is a Continuation of application Ser. No. 07/948,417 filed Sep. 22, 1992, now abandoned.

FIELD OF THE INVENTION

The invention generally relates to tuned filters and, more particularly, to notch filters that are suitable for use in removing one or more single or multiple frequency scrambling signals, injected into a television channel to eliminate the possibility of intelligible reception of video and/or audio information, or removing a video carrier in a television channel to prevent its reception.

BACKGROUND OF THE INVENTION

It has long been a customary practice for subscription television communication systems, i.e., a system in which the reception of a television program signal (generally recoverable by a group of television receivers) is limited to specifically authorized receivers, to scramble or encode their television transmission signals to prevent unauthorized reception by individuals who have not paid a subscription fee. Conventional hard-wired community antenna systems (CATV), for example, are representative of a typical subscription television communication system, although other systems have been developed that employ radio frequency (RF) transmission to subscribers instead of hardwiring. If the subscription television system provides more than one channel, it is also desirable to provide selected scrambling or securing of individual channels that are used to provide premium services.

One of the methods most commonly employed to prevent unauthorized reception is to add a scrambling signal or interfering carrier signal to the television transmission signal between its aural and visual carriers. The scrambling signal is added to the television transmission signal to provide additional information which causes a television receiver to reconstitute the scrambled television transmission signal in an incoherent form. The scrambling signal is removed by passing the scrambled television signal through a tuned notch filter at the site of an authorized television receiver.

Tuned notch filters to be utilized in the video/audio frequency removal or descrambling process must meet several critical requirements. For example, it is critical that the tuned notch filter have a high degree of stability and reliability. It must have high attenuation over the desired frequency band and sharp skirts to minimize unwanted attenuation of adjacent channels. In addition to the electrical requirements, the tuned notch filter must be small, preferably less than 0.825 inch diameter, to enable the notch filter to be utilized in typical installations where one or more filters are mounted on a directional tap on a strand, in a pedestal, or some other small enclosure. In today's market, more premium services are being offered which necessitates connecting more than one tuned notch filter end to end. It is therefore desirable to minimize the length of the tuned notch filter to allow more notch filters to be connected in the available space of the mounting locations.

In view of the above, it is the object of the invention to provide a notch filter which is shorter in length, while maintaining the electrical performance and diameter requirements.

SUMMARY OF THE INVENTION

The invention provides a tuned filter of reduced overall length in which two coils (air core inductors) are placed side by side, in mounting locations that are transverse with respect to the longitudinal direction of the filter, instead of in-line or diagonal to each other. The transverse mounting of the coils, depending on the number of poles in the filter, results in a reduction in the overall length of the filter to at least 25% to greater than 50% than can be realized in comparison to conventional in-line filter designs. The reduction in overall length is accomplished without increasing the diameter of the filter's housing by utilizing smaller coil diameters (coils less than 0.165 inches in diameter). In addition, the transverse mounting configuration permits the coils to be mounted in a central area between shields, which is further from the shields than in the conventional in-line or diagonal mounting locations, resulting in an improvement in the electrical performance for both the in band and high frequency responses of the tuned notch filter.

BRIEF DESCRIPTION OF THE DRAWINGS

Further objects, features, and advantages of the invention will become apparent from the following detailed description of a preferred embodiment of the invention taken in connection with the accompanying drawings, in which.

DETAILED DESCRIPTION OF THE PREFERRED EMBODIMENT

Figure 1:
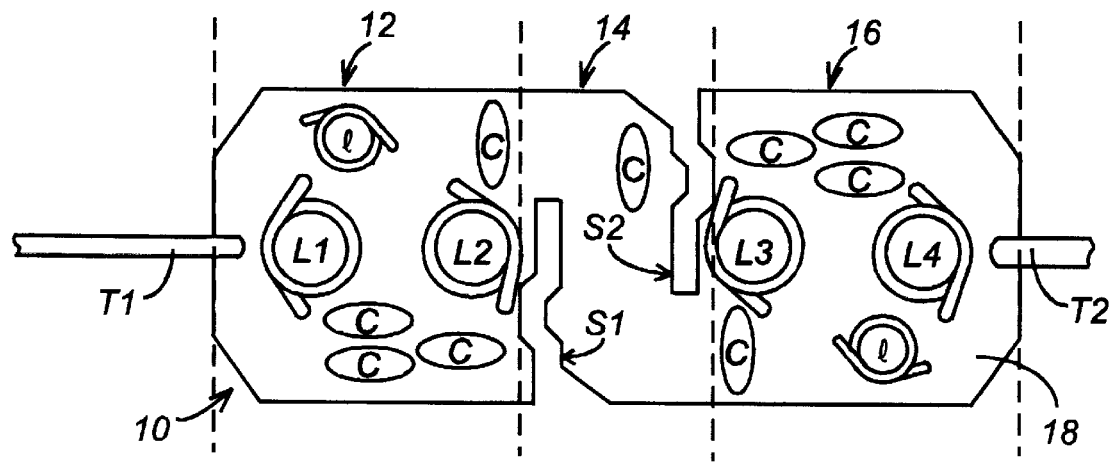
FIG. 1 is a top plan view of a conventional notch filter constructed on a circuit board using an in-line coil configuration.

A conventional in-line tuned notch filter 10 is shown in FIG. 1. The filter 10 includes a first filter section 12, an isolation section 14, and a second filter section 16 located on a common circuit board 18. Shield slots S1, S2 are cut into the circuit board 18 in the isolation section 14. Conductive shields (not shown) are located in the shield slots S1, S2 when the circuit board 18 is placed within a filter housing (not shown). In the illustrated design, tunable coils L1, L2 of the first filter section 12 and tunable coils L3, L4 of the second filter section 16 are centered in a line between an input terminal Ti and an output terminal T2 of the filter 10. The first and second filter sections 12, 16 also include a number of other circuit elements, for example capacitors (c) and inductors (l), that are located on the circuit board 18.

Figure 2:
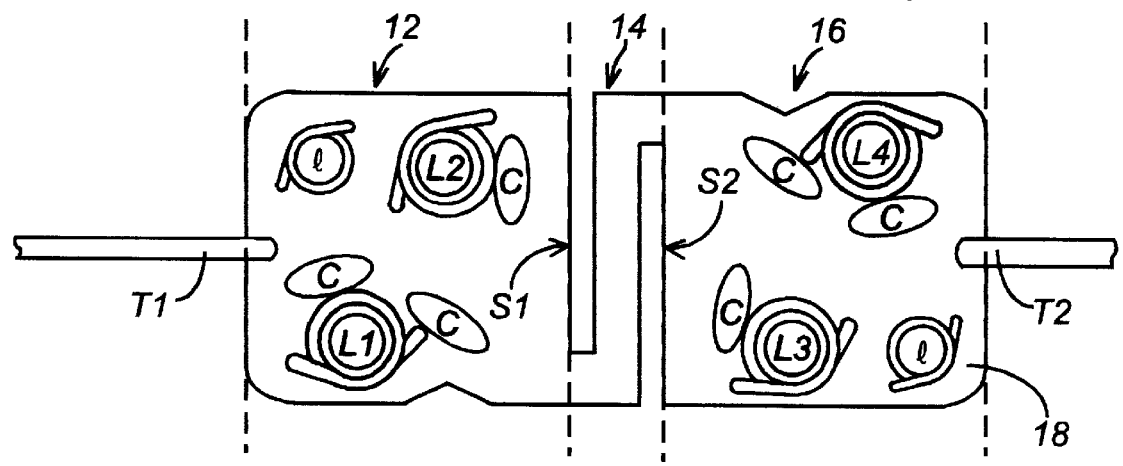
FIG. 2 is a top plan view of a conventional notch filter constructed on a circuit board using a diagonal coil configuration.

In order to shorten the distance between the input and output terminals T1, T2, and therefore the overall length of the filter, a diagonal filter design of the type illustrated in FIG. 2 had been proposed, wherein the coils L1, L2, L3, L4 have been moved off the center line of the filter in a diagonal fashion to reduce the distance required between the input and output terminals T1, T2. The diagonal coil configuration is limited, however, by the size of the coils (typically 0.175 inch or greater), the space required between the coils, the space required between each coil and the wall of the housing used to contain the filter, and the diameter of the filter housing.

Figure 3:
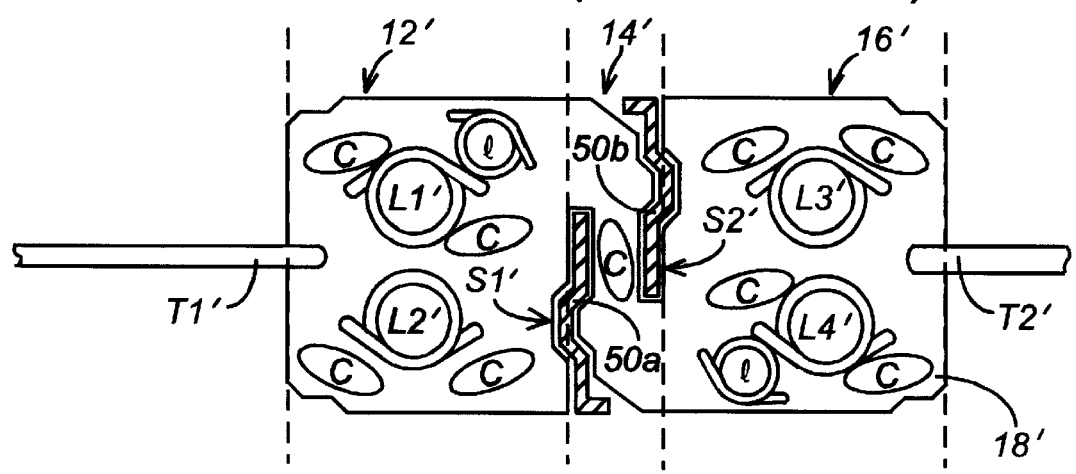
FIG. 3 is a top plan view of a notch filter constructed on a circuit board using a transverse coil configuration in accordance with the present invention.

In contrast to the conventional in-line or diagonal configurations shown in FIGS. 1 and 2, the invention arranges tunable coils L1', L2', L3', L4' within first and second filter sections 12', 14' in a position transverse to the longitudinal direction of filter which, in the illustrated embodiment, constitutes a center line passing through input and output terminals T1', T2' connected to the circuit board 18' as shown in FIG. 3. The size of the tunable coils L1', L2', L3', L4' are preferably reduced to less than about 0.165 inches in diameter, thereby allowing the coils L1'–L4' to be positioned in the transverse configuration without being too close to each other or to the wall of the housing used to contain the filter. The reduction in the size of the coils also removes the necessity of increasing the diameter of the filter housing.

Figure 4:
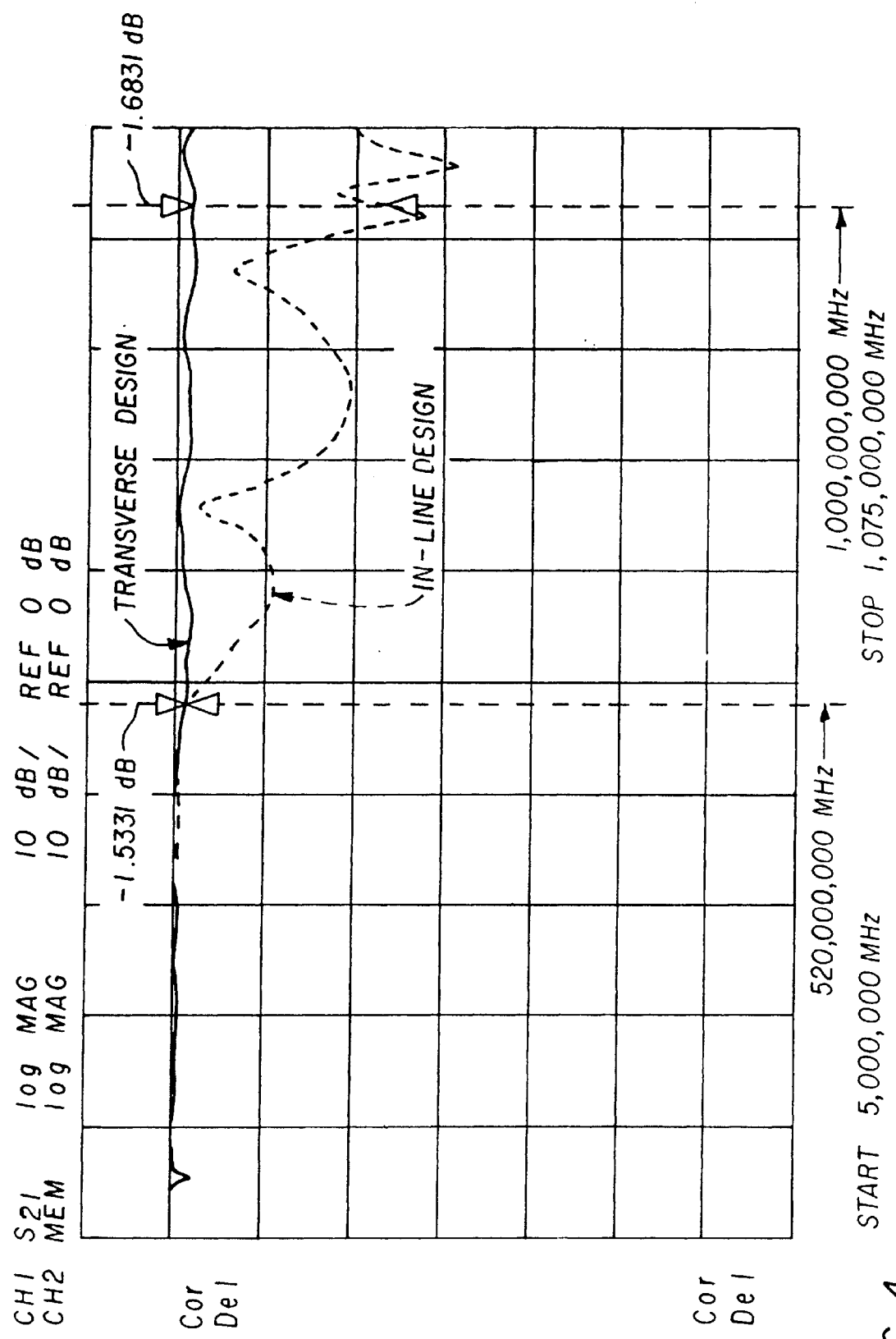
FIG. 4 is a data plot showing the frequency performance of a conventional filter employing an in-line coil configuration of FIG. 1 compared with the performance of a filter that utilizes the transverse configuration of FIG. 3.

The transverse configuration of FIG. 3 results in a significant decrease in the overall length of the filter. With the new approach, the coils are mounted in the central region of each of the first and second filter sections 12', 16' instead of at the ends of the filter sections, resulting in less parasitic action to the shield structures 50A, 50B which are located in the shield slots S1', S2' of the isolation section 14' when the circuit board 18' is placed within a filter housing. As shown in FIG. 4, the decrease in parasitic action results in slightly better performance in band and also allows an extension of the high frequency performance to at least 1 GHz with an attenuation of less than 3 dB. In particular, it can be seen from FIG. 4 that a prior art in-line design (dashed plot) has undesirable increasing attenuation beyond 520 MHz, whereas a comparative flat response (solid line plot) out to 1 GHz is achieved with the transverse design of the present invention.

Although the invention has been described above with reference to a specific preferred embodiment thereof, it will be appreciated that various modifications can be made within the spirit and scope of the appended claims. For example, although the invention has been described with reference to a notch filter having two sections, the invention is not limited to a two section filter and is applicable to isolated adjacent filter sections in a tuned filter having more than two sections. The invention is also applicable to tuned filters in general and is not limited solely to notch filters. In addition, the filter sections can be provided on separate circuit boards which are aligned within a filter housing. Further, the isolation section need not include shield slots, but instead can include a ground plane to which shields are clamped or otherwise connected.

What is claimed is:

1. A tuned filter, comprising: a single circuit board having a defined length and width and first and second opposed major surfaces both being substantially parallel to a single plane; an input terminal and an output terminal connected to first and second ends of said single circuit board, respectively, wherein said input and output terminals are located on a centerline passing through a longitudinal direction aligned along the length of said single circuit board, said centerline having a direction that is parallel to said plane; a first filter section comprising a first pair of tunable coils mounted on one of said first and second opposed major surfaces of said single circuit board along a first line transverse and substantially perpendicular to the centerline in a central region of the first filter section; a second filter section comprising a second pair of tunable coils mounted on said one of said first and second opposed major surfaces of said single circuit board along a second line transverse and substantially perpendicular to the centerline in a central region of the second filter section wherein said first and second pairs of tunable coils are mounted on opposite sides of said centerline and substantially perpendicular to said plane in a common direction extending away from said plane and wherein all of said tunable coils are tuned to substantially the same frequency to effect a notch at said frequency.

2. A tuned filter as claimed in claim 1, wherein each of the tunable coils is substantially cylindrical and a respective diameter of each of the tunable coils of said first an second pair of tunable coils is less than about 0.165 inch.

3. A tuned filter as claimed in claim 1, further comprising an isolation section located between said first and second filter sections.

4. A tuned filter as claimed in claim 3, wherein said isolation section includes first and second shield slots that are cut into said circuit board.

5. A tuned filter as claimed in claim 3, wherein said isolation section includes a shield for magnetically shielding said first and second filter sections from each other.

6. A tuned filter as claimed in claim 3, wherein said isolation section includes a pair of spaced apart shields for magnetically shielding said first and second filter sections from each other.

\* \* \* \* \*